(12) United States Patent
Hertz et al.

(10) Patent No.: US 8,698,439 B2
(45) Date of Patent: Apr. 15, 2014

(54) ELECTRICAL DEVICE AND METHOD FOR DETERMINING A PHASE FAILURE IN THE ELECTRICAL DEVICE

(75) Inventors: Dirk Hertz, Fichtenhof (DE); Marco Schönenberg, Kuemmersbruck (DE); Johann Seitz, Amberg (DE); Stefan Zitzler, Schwandorf (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 13/884,451

(22) PCT Filed: Nov. 17, 2010

(86) PCT No.: PCT/EP2010/067638
§ 371 (c)(1),
(2), (4) Date: May 9, 2013

(87) PCT Pub. No.: WO2012/065633
PCT Pub. Date: May 24, 2012

(65) Prior Publication Data
US 2013/0221892 A1    Aug. 29, 2013

(51) Int. Cl.
*G01R 31/02*    (2006.01)
(52) U.S. Cl.
USPC .......................................................... 318/490
(58) Field of Classification Search
None
See application file for complete search history.

(56) References Cited

U.S. PATENT DOCUMENTS

| | | | |
|---|---|---|---|
| 2001/0013771 A1 | 8/2001 | Wasmer | |
| 2007/0194734 A1* | 8/2007 | Weinmann et al. | 318/439 |
| 2011/0148258 A1* | 6/2011 | Tanaka et al. | 310/68 B |
| 2011/0163706 A1* | 7/2011 | Miura et al. | 318/400.27 |

FOREIGN PATENT DOCUMENTS

| | | |
|---|---|---|
| DE | 10 2005 016720 A1 | 10/2006 |
| EP | 1 107 010 A2 | 6/2001 |

OTHER PUBLICATIONS

International Search Report PCT/ISA/210 for PCT/EP2010/067638 dated Feb. 13, 2012.

* cited by examiner

*Primary Examiner* — Shawki S Ismail
*Assistant Examiner* — Zoheb Imtiaz
(74) *Attorney, Agent, or Firm* — Harness, Dickey & Pierce, P.L.C.

(57) ABSTRACT

A method is disclosed for determining a phase failure in an electrical device for driving or monitoring a three-phase AC motor, wherein the electrical device comprises a first, a second and a third line. In order to detect a phase failure in a line in the three-phase electrical device, in particular in a soft starter, the phase failure in the third line is determined by analysing the first and second lines, wherein the analysis includes: determining a value which characterizes a phase shift between a current in the first and second lines, and outputting a signal if the value which has been determined is in a range of values which characterizes a phase failure in the third line.

19 Claims, 2 Drawing Sheets

ELECTRICAL DEVICE AND METHOD FOR DETERMINING A PHASE FAILURE IN THE ELECTRICAL DEVICE

PRIORITY STATEMENT

This application is the national phase under 35 U.S.C. §371 of PCT International Application No. PCT/EP2010/067638 which has an International filing date of Nov. 17, 2010, which designated the United States of America, the entire contents of each of which are hereby incorporated herein by reference.

FIELD

At least one embodiment of the invention generally relates to a method for determining a phase failure in an electrical device and/or to an electrical device by which a phase failure in the electrical device can be determined.

BACKGROUND

Electrical devices such as, for example, soft starters, overload protection relays or motor starters are employed in the industrial automation field for the purpose of controlling or monitoring a three-phase alternating-current (AC) motor.

In addition to 3-phase controlled soft starters (three-phase power controllers), 2-phase controlled soft starters are also used in electrical soft starter devices for three-phase AC motors. In the case of the 3-phase controlled soft starters, three current transformers are present in most cases for the purpose of controlling and measuring the current in the three conductors (phases) of the soft starter device. In 2-phase controlled soft starters, one of the three conductors (phases) of the soft starter device is bridged and in principle one current transformer can be dispensed with (in the bridged conductor) in order to perform the soft start of the motor. The energy supply for the three-phase AC motor connected to the soft starter device is conducted and controlled by way of the three conductors of the soft starter device so that for example a defined startup behavior of the three-phase AC motor can be achieved.

The current measurement signals of the current transformers of the soft starter device can also be used inter alia for detecting a phase failure. However, it is problematic in this case if no current transformer is present in a conductor (phase) of the current transformer. This means that a phase failure in the conductor in which no current transformer is present cannot be detected and the motor would continue running on two phases until it was switched off by another protection mechanism. What is present in particular in the case of a phase failure is an interruption of a current that is to be transmitted inside the conductor.

A phase failure can also be detected with the aid of an analog voltage measurement. The absence of a voltage can be detected relatively easily if the voltage in a conductor falls below a specified threshold value. However, the corresponding hardware and firmware are necessary for this purpose so that said detection can be realized.

Phase failure detection on the basis of the current has hitherto been accomplished by way of three current transformers. If a current in a conductor falls below a specified threshold value, it can be assumed that no voltage is present at the conductor.

SUMMARY

At least one embodiment of the present invention is directed to detecting a phase failure in a conductor in a three-phase electrical device, in particular in a soft starter.

At least one embodiment of the present invention is directed to determining, solely on the basis of an analysis of two conductors (phases) of the electrical device, a phase failure in the other conductor (phase) of the electrical device.

A method is disclosed in an embodiment, for determining a phase failure in an electrical device for controlling or monitoring a three-phase AC motor, wherein the electrical device comprises a first, a second and a third conductor, wherein the phase failure in the third conductor is determined on the basis of an analysis of the first and second conductor, and wherein the analysis comprises the following steps of:
  determining a value characterizing a phase shift between a current in the first and second conductor,
  outputting a signal if the determined value lies in a value range which characterizes a phase failure in the third conductor, Further, an electrical device is disclosed in an embodiment, for controlling or monitoring a three-phase AC motor, wherein the electrical device includes a first, a second and a third conductor, as well as a processing unit and a current measuring device for determining a current in the first and second conductor, wherein a value characterizing a phase shift between the current in the first and second conductor can be determined with the aid of the current measuring device and a signal can be output by way of the processing unit if the determined value lies in a value range which characterizes a phase failure in the third conductor.

Advantageous developments of the invention are disclosed in dependent claims.

BRIEF DESCRIPTION OF THE DRAWINGS

The invention and embodiments of the invention are described and explained in more detail below with reference to the example embodiments illustrated in the figures, in which.

DETAILED DESCRIPTION OF THE EXAMPLE EMBODIMENTS

Figure 1:
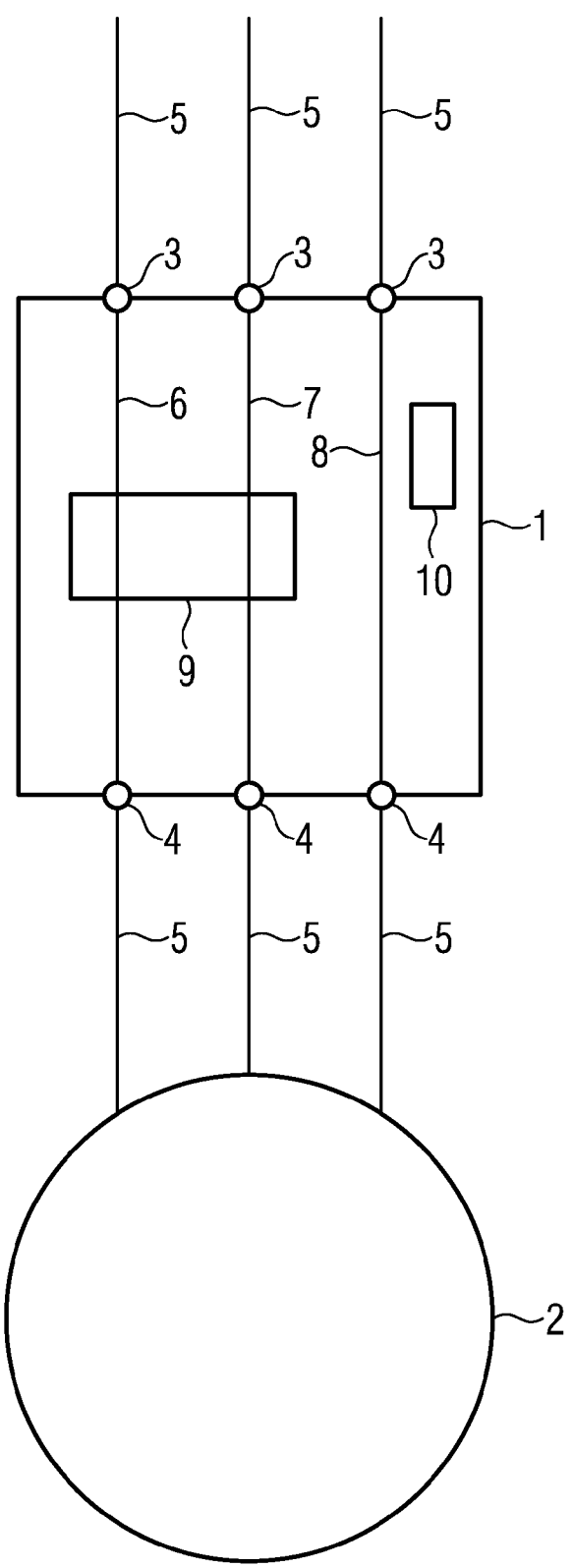
FIG. 1 is a schematic representation of an electrical device which is connected to a three-phase AC motor.

The electrical device of an embodiment is preferably a soft starter, an overload protection relay or a motor starter. The energy supply for the three-phase AC motor connected to the electrical device is conducted via the first, second and third conductor (phase) of the electrical device. The method of an embodiment finds application in particular during the operation of the three-phase AC motor and consequently during the operating state of the electrical device.

In the three-phase electrical device, which for example possesses a current measuring device only in two phases (of the first and second conductor), a phase failure in the third conductor (phase) can be detected on the basis of an analysis of the two currents in the first and second conductors and in particular their phase shift with respect to each other.

In the normal case (no phase failure in any of the conductors) all three line voltages are applied and the currents in the three conductors are phase-shifted by 120° in each case.

In the event of a phase failure in one of the two conductors in which current measurement is present, the phase failure can be detected on the basis of the level of the current and by the unbalance of the two currents. If the voltage is now absent in the third conductor (phase failure in the third conductor), in which no current transformer is present, no unbalance can be detected. The two currents are now phase-shifted by 180°. This means that a phase failure in the third conductor can be deduced based on an analysis of the phase shift of the currents in the first and second conductor. In this way it is possible, simply on the basis of an analysis of two conductors of the electrical device, to determine a phase failure in the other conductor of the electrical device.

As soon as it is detected on the basis of the analysis in respect of the phase shift between the first and second conductor that no correct phase shift is present, but that a phase shift is present which characterizes a phase failure in the third conductor, a signal is output so that a higher-level system will be notified about the phase failure. Preferably the value characterizing a phase shift which characterizes a phase failure in the third conductor and consequently lies within the value range must be present over a specific period of time to ensure that a temporary deviation which does not persist over the duration of the time period does not lead to a signal being output which indicates a phase failure.

For phase monitoring purposes the electrical device accordingly does not need to have one sensor per phase for monitoring a phase failure and can therefore be manufactured at lower cost and be embodied in a more compact design.

In the analysis in respect of the phase shift between the current in the first and second phase it is not necessary to determine the actual phase shift between the current in the first and second conductor. It is also sufficient if a value characterizing the phase shift is determined which can be compared with the value range so that information concerning a phase failure in the third conductor can be communicated. The value range consequently forms a range in respect of the determined value which characterizes a phase failure in the third conductor. The value characterizing a phase shift between the current in the first and second conductor reproduces in particular immediate information about the phase shift present in relation to the current of the first and second phase. Preferably the characterizing value directly reflects the phase shift between the current in the first and second conductor.

In an advantageous embodiment variant of the invention, the value range characterizes a phase shift of 150° to 210° between the first and second conductor. Consequently, if there is a phase shift of 150° to 210°, in particular 180°, present between the first and second phase, then the determined value characterizing a phase shift falls into the value range which characterizes a phase shift in the third conductor. A signal is consequently output which indicates a phase failure in the third conductor.

In another advantageous embodiment variant of the invention, the phase failure in the third conductor is determined solely on the basis of an analysis of the first and second conductor. Accordingly the third conductor does not need to include a sensor in order to determine a phase failure. Cost savings can be made as a result.

In another advantageous embodiment variant of the invention, the value characterizing a phase shift between the current in the first and second conductor is determined by way of measurements taken at the time of the zero crossing and/or peak value of the current in the first and second conductor. The phase shift or, as the case may be, the characterizing value can be determined for example on the basis of a time difference between the times of the zero crossings or peak values of the current of the first conductor with respect to those of the current of the second conductor. Equally, the phase shift can be deduced on the basis of an observation of the current at these times.

In another advantageous embodiment variant of the invention, the value characterizing a phase shift between the current in the first and second conductor is determined a number of times within a time window and the determined value is compared against the value range. The time window, which is preferably preset to a default, is for example a cycle duration of the current. The value characterizing a phase shift is therefore determined several times within the current cycle of the first or second conductor. Preferably the value, and hence the phase shift, is determined at least five times within the preset time window. The respective determined values are preferably compared with the value range in each case.

In another advantageous embodiment variant of the invention, the signal is not output until the determined value characterizing a phase shift which lies in the value range satisfies a further parameter. The parameter characterizes for example the frequency of occurrence of matching determined values of the phase shifts lying in the value range as compared with the values determined within a time interval (e.g. a cycle duration of the current). If a frequency of occurrence present is sufficient, the signal will be output. Equally, the parameter can represent a threshold value relating to the number of matching determined values of the phase shifts lying in the value range. If a sufficient number of matches are present, the signal is output. The analysis in respect of the parameter is preferably performed repeatedly within a defined time interval. The parameter can equally define a time interval within which a match of the repeated determinations of the characterizing values of the phase shift is to lie in the value range in each case. It is likewise conceivable for the analysis in respect of the parameter to be formed from a combination of a plurality of these and other criteria.

In another advantageous embodiment variant of the invention, the analysis comprises the following steps of:
a) determining the flow direction of the current in the first and second conductor simultaneously,
b) determining the number of differences in which the flow direction of the first conductor determined under step a) differs from the simultaneously determined flow direction of the second conductor,
c) establishing the number of determinations performed under step a),
d) outputting a signal if the ratio of the number of differences in relation to the number of determinations performed within a time window lies between 0% and 10% or 90% and 100%.

The concept of simultaneously determining the flow direction is also to be understood as determining the same with a slight offset in time. The greater the synchronicity in determining the flow direction in the two conductors, the more precisely the analysis will ultimately be performed in the electrical device.

Current sensors are preferably used in each case in the first and second conductor in order to determine the flow direction. If the individual current sensors for determining the flow direction are installed identically in this arrangement (i.e. an identical orientation of the flow direction is considered in relation to the flow direction of the first and second phase), then a deviation between 90 and 100% will be present in the event of a phase failure. If, on the other hand, the two current sensors are installed in opposition (i.e. an opposite orientation of the flow direction is considered in relation to the flow direction of the first and second phase), then a deviation between 0 and 10% will be present in the event of a phase failure.

If a phase shift of 180° is present, and consequently a phase failure in the third conductor, then except for the zero crossing the flow direction has an opposite orientation. The phase shift present, and in particular a phase failure present in the third conductor, can be deduced by way of the analysis of the flow direction of the current within the first and second conductor.

In another advantageous embodiment variant of the invention, the analysis comprises the following steps of:
a) determining the flow direction of the current in the first and second conductor simultaneously,
b) determining the number of matches in which the flow direction of the first conductor determined under step a) matches the simultaneously determined flow direction of the second conductor,
c) establishing the number of determinations performed under step a),
d) outputting a signal if the ratio of the number of matches in relation to the number of determinations performed within a time window lies between 11% and 89%.

In another advantageous embodiment variant of the invention, the electrical device comprises a processing unit and a current measuring device, wherein step a) is performed with the aid of the current measuring device, and steps b), c) and d) are performed by way of the processing unit. For each phase/conductor the current measuring device preferably includes at least one current sensor which can determine the flow direction within the conductor. Preferably the current measurement is also performed by the current measuring device.

In another advantageous embodiment variant of the invention, step a) is performed at least five times within the time window. Given a line frequency of 50 Hz, step a) is preferably performed at least every 400 microseconds.

In another advantageous embodiment variant of the invention, the number determined under step b) and the number of determinations performed under step a) are reset, preferably after the time window has elapsed.

In another advantageous embodiment variant of the invention, the processing unit comprises a first and a second counter, the number determined under step b) being counted by way of the first counter and the number determined under step c) being counted by way of the second counter.

In another advantageous embodiment variant of the invention, the time window is equal to at least one cycle duration of the current in the first or second conductor. The time window is preferably preset to a default at the factory. It will therefore last for at least one cycle duration of the current.

In another advantageous embodiment variant of the invention, the electrical device can perform a current measurement in the first and second conductor only. Preferably, except for the current measurement in the first and second conductor, no further current and/or voltage measurements are performed on the individual conductors in the electrical device.

In another advantageous embodiment variant of the invention, the flow direction of the current in the first and second conductor can be determined simultaneously with the aid of the current measuring device, and the processing unit can be used:
to determine the number of differences in which the flow direction of the first conductor determined by the current measuring device differs from the simultaneously determined flow direction of the second conductor,
to establish the number of simultaneous determinations of the flow direction of the current in the first and second conductor performed by the current measuring device, and
to output a signal if the ratio of the number of differences in relation to the number of determinations performed within a time window lies between 0% and 10% or 90% and 100%.

In another advantageous embodiment variant of the invention, the flow direction of the current in the first and second conductor can be determined simultaneously with the aid of the current measuring device, and the processing unit can be used:
to determine the number of matches in which the flow direction of the first conductor determined by the current measuring device matches the simultaneously determined flow direction of the second conductor,
to establish the number of simultaneous determinations of the flow direction of the current in the first and second conductor performed by the current measuring device, and
to output a signal if the ratio of the number of matches in relation to the number of determinations performed within a time window lies between 11% and 89%.

The number of determined matches and/or differences as well as the number of simultaneous determinations of the flow direction of the current in the first and second conductor performed by the current measuring device can preferably be reset by the processing unit after the time window has elapsed.

In an advantageous embodiment variant of the invention the processing unit includes at least one counter by way of which the number of determined matches and/or differences as well as the number of simultaneous determinations performed by the current measuring device can be counted.

The time window, which is preferably preset to a default at the factory, is preferably equal to at least one cycle duration of the current in the first or second conductor.

In another advantageous embodiment variant of the invention the electrical device is a soft starter.

FIG. 1 is a schematic representation of an electrical device 1 which is connected to a three-phase AC motor 2. Three phases of the three-phase AC motor 2 are connected by way of the electrical device 1 to a power supply network so that the three-phase AC motor 2 can be supplied with energy. The electrical device 1 depicted here is a soft starter device 1. The soft starter device 1 has a connection point 3 on the input side and a connection point 4 on the output side for each phase, wherein the connection points can be connected to each other in an electrically conductive manner by way of an internal conductor 6,7,8 of the soft starter device.

The energy provided for the three-phase AC motor is fed in from a power supply network to the soft starter device 1 via the conductors 5 connected on the input side. The energy is passed on to the three-phase AC motor 2 by way of the external conductors 5 connected to the connection points 4 on the output side. The soft starter device 1 consequently has three phases. In this arrangement the first conductor 6 of the soft starter device 1 reflects the first phase of the system (soft starter device 1 and three-phase AC motor 2). The second conductor 7 reflects the second phase of the system. The third conductor 8 reflects the third phase of the system.

The soft starter device 1 additionally comprises a current measuring device 9 and a processing unit 10. The current in the first and second conductor 6,7 is measured by way of the current measuring device 9. No operative connection exists in the soft starter device 1 between the third conductor 8 and a current sensor, meaning that the current in the third conductor 8 cannot be measured by the soft starter device 1. Consequently, if a phase failure is present in the third conductor 8, the third conductor 8 includes no current sensor that can detect a phase failure. Furthermore the soft starter device 1 includes no voltage sensor which can determine a voltage in respect of the first, second and third conductor 6,7,8. The current measuring device 9 comprises a first and second current sensor, the first current sensor being able to determine a current in the first conductor 6 and the second current sensor being able to determine a current in the second conductor 7. The flow direction of the current in the first and second conductor 6,7 can also be determined by way of the current measuring device 9 and its current sensors.

The current measuring device 9 is connected to the processing unit 10 in such a way that the determined measured values of the current measuring device 9 can be passed on to the processing unit 10. The processing unit 10 is able to deduce the phase shift of the current that is present between the first and second conductor 6,7 from the measured values determined by the current measuring device 9. The current measuring device 9 consequently supplies a value characterizing a phase shift between the current in the first and second conductor 6,7. The processing unit 10 can compare this determined value with a value range. This value range characterizes a phase failure in the third conductor 8. Consequently, if the determined value lies within this value range, a phase failure is present in the third conductor 8. Since the determined value characterizes a phase shift between the current in the first and second conductor 6,7, a phase failure in the third conductor 8 is consequently determined on the basis of the phase shift between the current in the first and second conductor 6,7.

In the normal case (i.e. no phase failure is present and the line voltages are applied to all three phases 6,7,8) the currents in the three phases 6,7,8 are phase-shifted by 120° in each case. The phase shift between the current in the first and second conductor 6,7 consequently equals 120°. The value determined in normal operation and characterizing a phase shift between the current in the first and second conductor 6,7 consequently reflects a phase shift around 120°. A comparison of the determined value with the value range would yield as result that the value does not lie within the value range and therefore no phase failure is present in the third conductor 8.

If, on the other hand, a phase failure is present in the third conductor 8, then a phase shift around 180° is present between the current in the first and second conductor 6,7. A determination of the value characterizing a phase shift between the current in the first and second conductor 6,7 consequently leads to a different value than in the case of the determination during normal operation. If this determined value is compared with the value range, the processing unit 10 will detect that the determined value, which characterizes a phase shift around 180° between the first and second conductor 6,7, lies within the value range and therefore a phase failure is present in the third conductor 8. The value range preferably lies between 150° and 210°.

The advantage of a soft starter device 1 of such a type resides, in particular, in the fact that a phase failure in the third conductor 8 can be deduced simply by monitoring the first and second conductor 6,7. The device 1 can be embodied in a more compact design and in addition cost savings can be achieved because there is no need to provide measurement device(s) for the third conductor 8 in order to check for a phase failure in the third conductor 8.

If a phase failure occurs in the first and second conductor 6,7, this phase failure can be detected on the basis of the level of the current and by the unbalance of the two currents. These values can be determined by the current measuring device 9.

The following method for determining a phase failure in the third phase 8 has proven particularly advantageous. The flow direction of the two currents in the first and second conductor 6,7 is evaluated repeatedly with the aid of analog/digital sampling while the three-phase AC motor 2 is switched on. Each current is sampled e.g. every 400 ms and the sign of the sample value is evaluated.

For this purpose there are two counters which are set to zero at the start of a current cycle (of the first or second phase). One counter counts the total number of sample values taken within a cycle and the second counter is incremented by 1 during the sampling whenever the two currents have a different sign (opposite flow direction). At the end of a current cycle (i.e. every 20 ms at 50 Hz) these counters are converted into a ratio and evaluated. This takes place within the processing unit 10. If a phase failure is present in the third conductor 8 (of the third phase), this ratio lies between 0 and 10% (overlap) or between 90 and 100% (no overlap) within a cycle.

The two different percentage ranges are dependent on how the current sensor of the first conductor 6 is installed with respect to the current sensor of the second conductor 7, since the manner of installation of the current sensor determines the flow direction and therefore the sign of the current of the corresponding conductor 6,7. Through the targeted evaluation of the two current curves of the current present in the first and second conductor 6,7 by the current measuring device 9 and the processing unit 10 it is possible to dispense with a third current sensor for the third conductor 8. Furthermore no analog voltage measurement is required in all three conductors 6,7,8. A phase failure can therefore be detected in all three phases 6,7,8 with the aid of just two current sensors (current transformers), without need of further aids.

Figure 2:
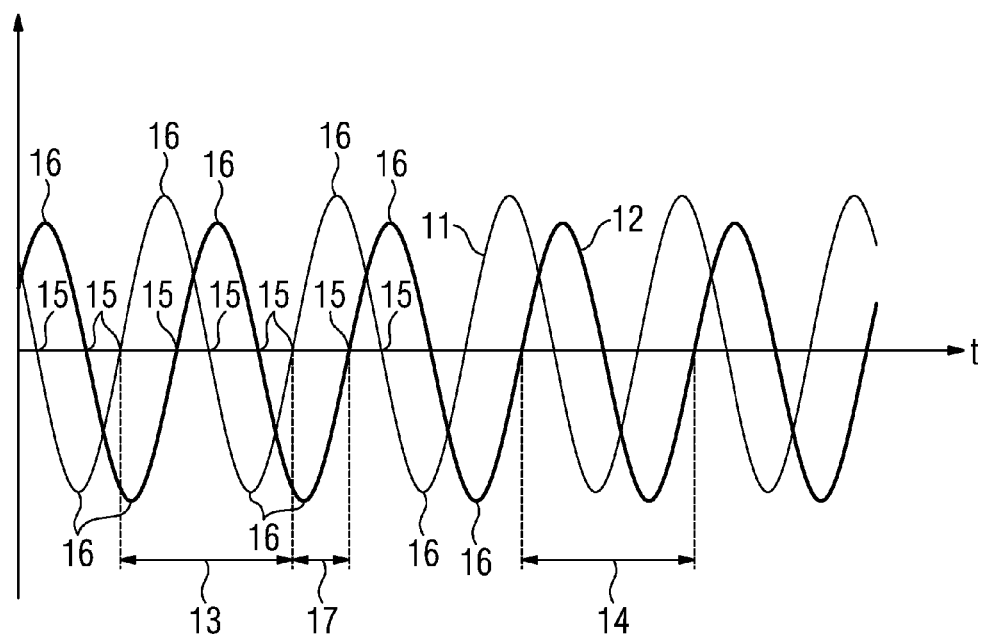
FIG. 2 is a schematic representation of the currents in the first and second conductor when all three voltages are present.

FIG. 2 is a schematic representation of the currents in the first and second conductor when all three voltages are applied to the three phases of the electrical device. There is therefore no phase failure present in the first, second and third conductor. The characteristic curve of the current of the first and second conductor over time is visualized by way of the depicted Cartesian coordinate system. The variation with time of the current (ordinate axis) is represented by way of the abscissa axis. The coordinate system shows the first current curve 11 of the first conductor and the second current curve 12 of the second conductor. The current of the first conductor is phase-shifted by 120° relative to the current of the second conductor.

In a three-phase system this is indicative of correct operation. In the case of the current curves 11,12 the peak value 16 and the zero crossing 15 of the respective current curve 11,12 are depicted in some cases by way of example. The time window 13 denotes a cycle of the first current curve 11. The time window 14 denotes a cycle of the second current curve 12. The zero crossing 15 of the first and second current curve 11,12 has a time offset 17. The phase shift between the first current curve 11 and the second current curve 12 reflects the normal state of the soft starter device in the case of a correct energy supply for the three-phase AC motor. In other words, no phase failure is present in any of the phases of the soft starter device.

Figure 3:
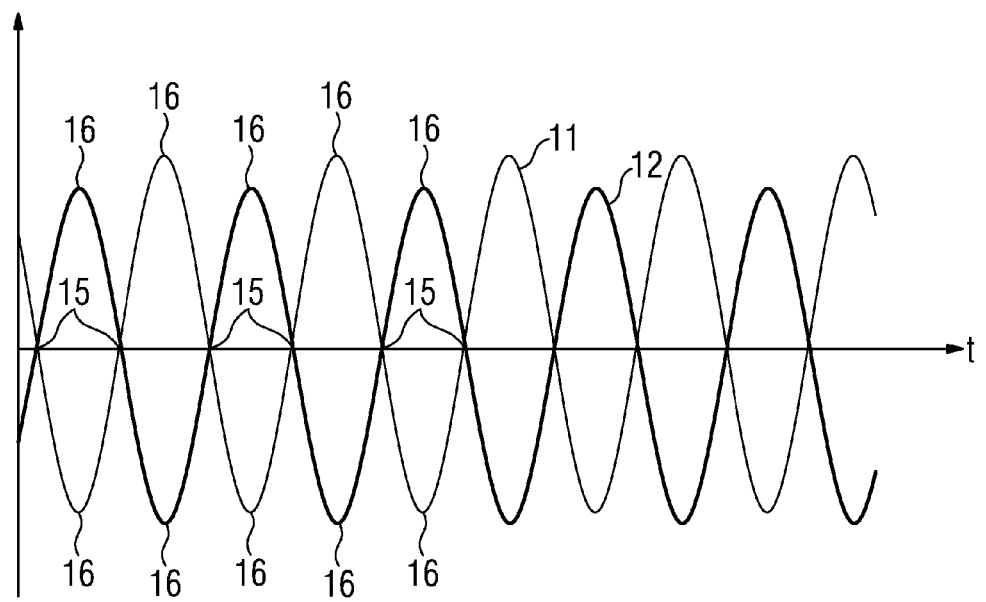
FIG. 3 is a schematic representation of the currents in the first and second conductor when a phase failure is present in the third conductor.

FIG. 3 is a schematic representation of the currents in the first and second conductor when a phase failure is present in the third conductor. Compared with FIG. 2, the first current curve 11 now exhibits a phase shift of 180° relative to the second current curve 12. The status of the third conductor (third phase) can be deduced on the basis of an analysis of the phase shift between the current in the first conductor and the second conductor, and therefore of a comparison of the first current curve 11 with the second current curve 12. Since the phase shift between the first current curve 11 and the second current curve 12 is not 120°, but 180°, a phase failure must be present in the third conductor.

Because the soft starter device conducts an analysis of the phase shift or of a value characterizing the phase shift by way of a value range which characterizes a phase failure, the correct operation of the third phase can be deduced simply on the basis of the analysis of the first and second conductor of the soft starter device. When the flow directions of the first and second current curve 11,12 are determined simultaneously and the two flow directions are compared, the flow direction is always embodied in opposition with a 180° phase offset except for the zero crossing 15. Consequently, the status of the third phase can be deduced on the basis of an analysis of the flow direction of the first current curve 11 with respect to the flow direction of the second current curve 12. A phase failure of the third conductor can be detected for example by way of a percentage evaluation of the differences of the flow directions with respect to the determinations.

The invention claimed is:

1. A method for determining a phase failure in an electrical device for controlling or monitoring a three-phase AC motor, wherein the electrical device including a first, a second and a third conductor and a current measuring device and the current in the first and second conductor being measurable by way of the current measuring device, wherein the phase failure in the third conductor is determined solely on the basis of an analysis of the currents of the first and second conductor that were measured with the aid of the current measuring device, the analysis comprising:
   a) determining the flow direction of the current in the first and second conductor simultaneously;
   b) determining a number of differences in which the flow direction of the first conductor determined under step a) differs from the simultaneously determined flow direction of the second conductor, or establishing a number of matches in which the flow direction of the first conductor determined under step a) matches the simultaneously determined flow direction of the second conductor;
   c) establishing the number of determinations performed under step a);
   d) outputting, if the number of differences was determined under step b), a signal if the ratio of the number of differences in relation to the number of determinations performed within a time window lies in a value range which characterizes a phase failure in the third conductor, or outputting, if the number of matches was determined under step b), a signal if the ratio of the number of matches in relation to the number of determinations performed within a time window lies in a value range which characterizes a phase failure in the third conductor.

2. The method as of claim 1, wherein the value range characterizes a phase shift of 150° to 210° between the first and second conductor.

3. The method of claim 2, wherein
   if the number of differences was determined under step b), the value range is present if the ratio of the number of differences in relation to the number of determinations performed within a time window lies between 0% and 10% or 90% and 100%, or
   if the number of matches was determined under step b), the value range is present if the ratio of the number of matches in relation to the number of determinations performed within a time window lies between 11% and 89%.

4. The method of claim 3, wherein the electrical device comprises a processing unit and a current measuring device, and wherein step a) is performed with the aid of the current measuring device (9) and steps b), c) and d) are performed by way of the processing unit.

5. The method of claim 3, wherein the number determined under step b) and the number of determinations performed under step a) are reset.

6. The method of claim 3, wherein the processing unit comprises a first and a second counter, the number determined under step b) being counted by way of the first counter and the number determined under step c) being counted by way of the second counter.

7. The method of claim 5, wherein the number determined under step b) and the number of determinations performed under step a) are reset after the time window has elapsed.

8. The method of claim 4, wherein the number determined under step b) and the number of determinations performed under step a) are reset.

9. The method of claim 8, wherein the number determined under step b) and the number of determinations performed under step a) are reset after the time window has elapsed.

10. The method of claim 1, wherein the time window is equal to at least one cycle duration of the current in the first or second conductor.

11. The method of claim 1, wherein
    if the number of differences was determined under step b), the value range is present if the ratio of the number of differences in relation to the number of determinations performed within a time window lies between 0% and 10% or 90% and 100%, or
    if the number of matches was determined under step b), the value range is present if the ratio of the number of matches in relation to the number of determinations performed within a time window lies between 11% and 89%.

12. An electrical device for controlling or monitoring a three-phase AC motor, comprising:
    a first, a second and a third conductor;
    a processing unit; and
    a current measuring device, configured to determine a current in the first and second conductor, wherein a flow direction of the current in the first and second conductor is simultaneously determinable with the aid of the current measuring device, the processing unit being configured:
       to determine a number of differences in which the flow direction of the first conductor determined by the current measuring device differs from the simultaneously determined flow direction of the second conductor, or
       to determine a number of matches in which the flow direction of the first conductor determined by the current measuring device matches the simultaneously determined flow direction of the second conductor, the processing unit being further configured to
       establish a number of simultaneous determinations of the flow direction of the current in the first and second conductor that were performed by the current measuring device, and
          to output a signal if the ratio of the number of differences or matches in relation to the number of determinations performed within a time window lies in a value range which characterizes a phase failure in the third conductor.

13. The electrical device of claim 12, wherein the electrical device can perform is configured to a current measurement in the first and second conductor only.

14. The electrical device of claim 12, wherein, in a determination of the number of differences, the value range is present if the ratio of the number of differences in relation to the number of determinations performed within the time window lies between 0% and 10% or 90% and 100%, or in a determination of the number of matches, the value range is present if the ratio of the number of matches in relation to the number of determinations performed within the time window lies between 11% and 89%.

15. The electrical device one of claim 12, wherein the electrical device is a soft starter.

16. The electrical device of claim 13, wherein, in a determination of the number of differences, the value range is present if the ratio of the number of differences in relation to the number of determinations performed within the time window lies between 0% and 10% or 90% and 100%, or, in a determination of the number of matches, the value range is present if the ratio of the number of matches in relation to the number of determinations performed within the time window lies between 11% and 89%.

17. The electrical device of claim 13, wherein the electrical device is a soft starter.

18. The electrical device of claim 14, wherein the electrical device is a soft starter.

19. The electrical device of claim 16, wherein the electrical device is a soft starter.

* * * * *